(12) United States Patent
Keller et al.

(10) Patent No.: US 6,293,139 B1
(45) Date of Patent: Sep. 25, 2001

(54) METHOD OF DETERMINING PERFORMANCE CHARACTERISTICS OF POLISHING PADS

(75) Inventors: Kevin A. Keller, St. Charles; Gerald A. Whitman, Jr., O'Fallon, both of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/432,928

(22) Filed: Nov. 3, 1999

(51) Int. Cl.[7] .............................. G01B 5/28; B23Q 17/09; G01N 3/56
(52) U.S. Cl. ..................................... 73/105; 73/104; 73/7
(58) Field of Search ........................... 73/104, 105, 1.89, 73/7

(56) References Cited

U.S. PATENT DOCUMENTS

| | | |
|---|---|---|
| 4,417,478 | 11/1983 | Jon et al. . |
| 5,005,205 | 4/1991 | Ellozy et al. . |
| 5,010,578 * | 4/1991 | Siener et al. ............................. 382/8 |
| 5,317,901 * | 6/1994 | Khan ..................................... 73/45.5 |
| 5,320,101 | 6/1994 | Faupel et al. . |
| 5,377,451 * | 1/1995 | Leoni et al. .......................... 451/287 |
| 5,450,326 | 9/1995 | Black . |
| 5,508,915 | 4/1996 | Tsao et al. . |
| 5,664,987 | 9/1997 | Rentein . |
| 5,762,536 * | 6/1998 | Pant et al. ................................ 451/6 |
| 5,872,633 | 2/1999 | Holzapfel et al. . |

FOREIGN PATENT DOCUMENTS

| | | |
|---|---|---|
| XP 002157653 | 9/1992 | (DE) . |
| 0 803 327 A2 | 10/1997 | (EP) . |
| PCT/US 00/28196 | 3/2001 | (WO) . |

OTHER PUBLICATIONS

R.A. Johnson & D. W. Wichern, Applied Multivariate Statistical Analysis 470–78, 480–482, 509–510, 539 (2d ed., Prentice Hall International 1988).

* cited by examiner

Primary Examiner—Hezron Williams
Assistant Examiner—Katina Wilson
(74) Attorney, Agent, or Firm—Senniger, Powers, Leavitt & Roedel

(57) ABSTRACT

A testing and analyzing method for determining the performance characteristics of a production lot of polishing pads. The first step requires polishing a plurality of semiconductor wafers with a selected number of polishing pads from the production lot of polishing pads. At least a portion of the surface area of each of the plurality of semiconductor wafers is divided into a plurality of sites. At least one wafer characteristic from each site is measured. The wafer characteristic from each site is incorporated into a discriminant function selected to predict the performance characteristics of a production lot of polishing pads by the quantitative level of the data obtained from a plurality of semiconductor wafers polished by the selected number of polishing pads.

11 Claims, 1 Drawing Sheet

METHOD OF DETERMINING PERFORMANCE CHARACTERISTICS OF POLISHING PADS

BACKGROUND OF THE INVENTION

This invention relates to polishing pads for polishing semiconductor wafers, and more particularly to determining performance characteristics of a production lot of polishing pads using discriminant analysis.

Semiconductor wafers are generally prepared from a single crystal ingot sliced into individual wafers. The wafers are subjected to several processing operations to reduce the thickness of the wafer, remove damage caused by the slicing operation, and create a highly reflective surface. In conventional wafer shaping processes, a lapping operation is performed on the front and back surfaces of the wafer using an abrasive slurry and a set of rotating lapping plates. The lapping operation reduces the thickness of the wafer to remove surface damage induced by the slicing operation and to make the opposing side surfaces of each wafer flat and parallel. Upon completion of the lapping operation, the wafers are subjected to a chemical etching operation to reduce further the thickness of the wafer and remove mechanical damage produced by the prior processing operations. One side surface of each wafer (often called the "front" side of the wafer) is then polished using a polishing pad, a colloidal silica slurry (polishing slurry) and a chemical etchant to ensure that the wafer has a highly reflective, damage-free surface. This invention relates in particular to the polishing process.

Semiconductor wafers used as starting materials for the fabrication of integrated circuits must meet certain surface flatness requirements. Such wafers must be particularly flat to print circuits on them by, for example, an electron beam-lithographic or photolithographic process. Wafer flatness in the focal point of the electron beam delineator or optical printer is important for uniform imaging in the electron beam-lithographic and photolithographic processes. The flatness of the wafer surface directly influences device line width capability, process latitude, yield and throughput. The continuing reduction in device geometry and increasingly stringent device fabrication specifications force manufacturers of semiconductor wafers to prepare increasingly flatter wafers. Wafers can be characterized for flatness in terms of a global flatness variation parameter (for example, total thickness variation ("TTV")) or in terms of a local site flatness variation parameter (e.g., Site Total Indicated Reading ("STIR") or Site Focal Plane Deviation ("SFPD")) as measured against a reference plane of the wafer (e.g., Back Reference Center Focus ("SBIR") or Site Best Fit Reference Plane ("SFQR")). A more detailed discussion of the characterization of wafer flatness can be found in F. S HIMURA, Semiconductor Silicon Crystal Technology 191–195 (Academic Press 1989).

Because a wafer's flatness is of paramount importance, production variables affecting wafer flatness are closely monitored. The quality of the polishing pad used to polish the wafer, for example, directly affects the flatness characteristics of the polished wafer. Therefore, an accurate assessment of the polishing pad quality, and particularly identification of bad lots, is important to semiconductor wafer production. Historically, polishing pad performance between production lots has been variable, due to minor variations in the supplier's manufacturing process. In contrast, within a production lot, the quality of the pads is typically consistent because each pad is stamped from the same raw material. Therefore, each production lot of polishing pads must be separately assessed to determine its quality and usefulness. To assess the quality of a particular production lot of wafers, several pads must be tested on Grade I semiconductor material to assess the overall quality of the pad. Grade I semiconductor material is expensive to manufacture, and its use in testing pad quality places the polished semiconductor material at risk of flatness degradation which may render the wafer unsuitable for use. Therefore, any reduction in the amount of Grade I material placed at risk during the testing process is beneficial.

Assessing the quality of a production lot of wafers traditionally has been a qualitative task, based upon the wafer shape and other flatness measures. According to the prior methodology, once a current production lot of good polishing pads is exhausted, a new production lot of pads is used in the wafer polishing process. When these new pads are installed on the polishers, their quality is unknown. As the new pads are broken in, if the quality of wafer flatness remains high, the pads are considered good and not analyzed further. Alternately, if wafer quality appears to suffer and substandard polishing pads are suspected, pad quality is evaluated. By evaluating the flatness of the wafers with different flatness measures, as described above, the questionable production lot is characterized as bad or marginal. This in-use type evaluation process is time consuming and costly. Because the pads are used in production before their quality is appreciated, they place many Grade I wafers at risk of flatness degradation and possible loss before a problem is identified. This problem is exacerbated if quality problems associated with the pads are difficult to detect and go undetected for significant periods. Once the lot quality is determined to be bad, the lot is rejected and returned to the pad manufacturer. Marginal production lots are subject to further pad testing and further destruction of Grade I material until a determination of lot quality can be made. Because this process is time consuming and subjects many Grade I wafers to risk of flatness degradation and potential loss, a more efficient and less costly methodology for determining pad quality is necessary.

SUMMARY OF THE INVENTION

Among the several objects of this invention may be noted the provision of an improved methodology that reduces how much Grade I semiconductor material is placed at risk of flatness degradation while testing polishing pad quality; the provision of such a methodology that speeds the reaction time to identify poorly performing pad production lots; the provision of such a methodology that increases the accuracy of the determination of pad production lot quality; the provision of such a methodology that decreases the number of polishers required to determine pad quality; the provision of such a methodology that employs a directive, proactive, methodology which actively determines the quality of a production lot of polishing pads; the provision of such a methodology that uses quantitative, rather than qualitative, measurements to determine pad production lot quality; and the provision of such a methodology that creates an easily understandable grading system, allowing quick comparison of production lot quality to predetermined standards.

Generally, a testing and analyzing method for determining the performance characteristics of a production lot of polishing pads is disclosed. The first step requires polishing a plurality of semiconductor wafers with a selected number of polishing pads from the production lot of polishing pads. At least a portion of the surface area of each of the plurality of semiconductor wafers is divided into a plurality of sites. At least one wafer characteristic from each site is measured. The wafer characteristic from each site is incorporated into a discriminant function selected to predict the performance characteristics of a production lot of polishing pads by the quantitative level of the data obtained from a plurality of semiconductor wafers polished by the selected number of polishing pads.

Other objects and features will be in part apparent and in part pointed out hereinafter.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
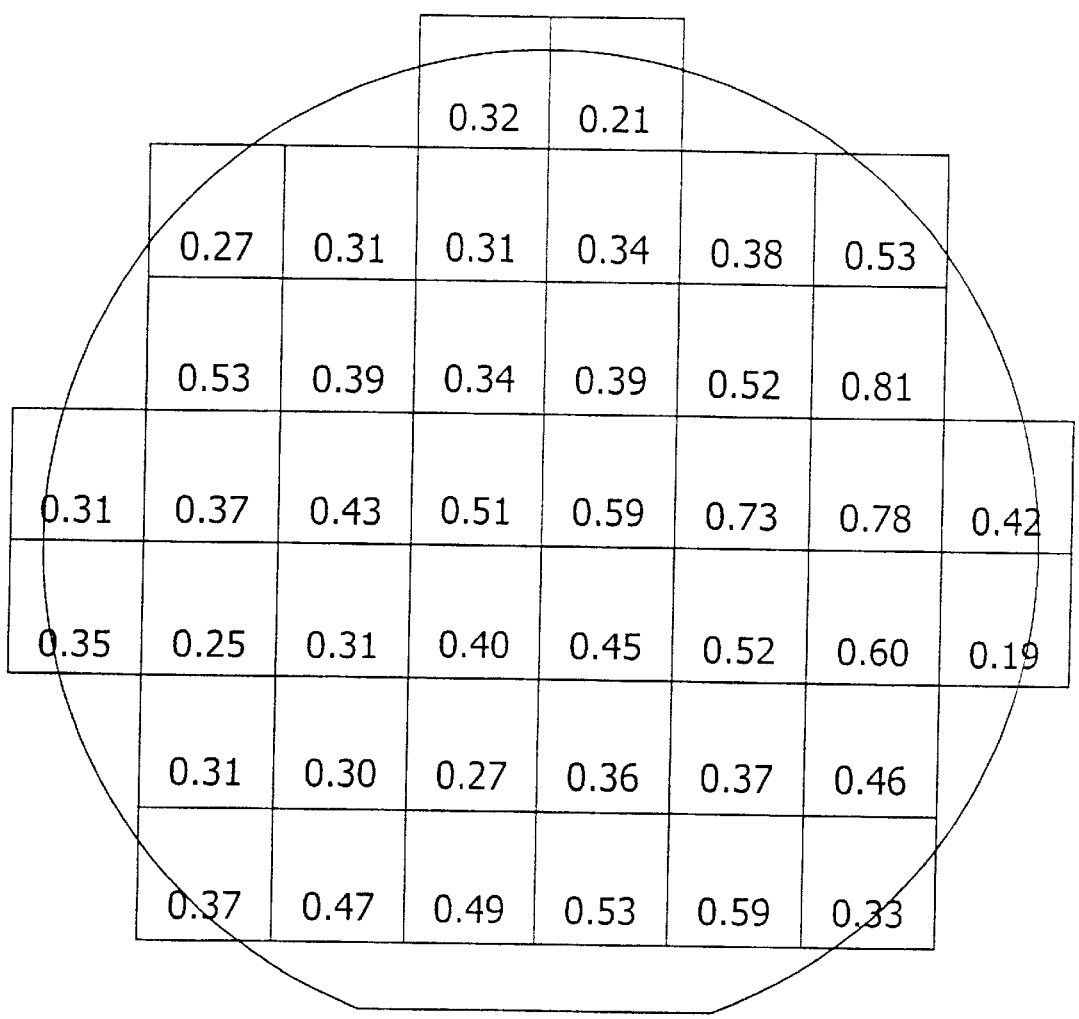
FIG. 1 is a schematic of a 150 mm wafer divided into sites.

Generally, the present method is adapted to efficiently determine if a production lot of polishing pads is of good or bad quality. An early determination of pad quality is essential to semiconductor wafer production because it ensures proper polishing and reduces the amount of material polished by pads of bad quality. The present method preferably polishes 20 to 40 wafers with pads of unknown quality from the same production lot. Various sites on the wafers are then measured for flatness and the results are inserted into a discriminant function developed for the present method. The results of the discriminant function show whether the polishing pads, and the lot from which they were manufactured, is of good or bad quality.

Discriminant analysis is a statistical tool designed to categorize objects into classes. By creating a discriminant function based on a discriminant analysis, the function can serve as a method for assigning objects to their proper class. To perform a discriminant analysis, pertinent types of observations from a particular group of similar objects must be identified. These might include dimensions, tolerances, quality measures, etc. Then, the classes of interest must be defined, as the goal of the discriminant analysis is to place each object into its proper class. These classes might be good and bad, high quality and low quality, accept or do not accept, etc. These classes represent the ultimate goal of the classification process. New data observations can then be applied to the discriminant function, predicting in which class the data belongs. For every p qualitative levels, or classes, there exists (p-1) discriminant functions. In the preferred embodiment, two classes, good and bad, were selected, producing one discriminant function. For "good" and "bad" classes, the discriminant function will predict if a given set of new data is "good" or "bad."

To determine in what class each object belongs, relevant observations are recorded for each object. The discriminant analysis compiles these multiple observations and transforms the multivariate observations into univariate observations. These univariate observations separate the objects belonging in different classes to a greater degree than the multivariate observations. More specifically, linear combinations of the relevant multivariate observations are mathematically manipulated to create the univariate observations. The linear combinations are specifically selected in the discriminant analysis to maximize the squared distance between the mean of the observations from each class. By maximizing the squared distance between the observations from each class, the univariate distributions enhance the impact of those observations that most clearly and easily categorize the objects into classes. This process also reduces the impact of those observations that do not help differentiate between the classes. By maximizing the impact of those observations that most clearly separate the objects into their proper class, the univariate observations are useful tools for separating objects into defined classes where the variety and number of observations are great and an understanding of which observations best predict class membership is difficult.

To establish the discriminant function initially, two sets of wafers were distributed on 14 polishers and polished. The first set was polished with polishing pads from a good production lot. The second set was polished with polishing pads from a bad production lot. The polishing pads characterized as "good" or "bad" were characterized as such by using prior art methods for determining quality. Site flatness measurements were recorded and flatness data calculated for all wafer. A selection of 24 wafers from each class, good and bad, were randomly selected to be the data points used in establishing the discriminant function. The mathematical manipulations required to establish the discriminant function are set out in this specification after the description of the method used to apply the function. By inserting the remaining wafer data into the discriminant function, the accuracy of the discriminant function was confirmed. The discriminant function correctly predicted whether the wafers were polished on a good lot or bad lot of polishing pads.

The first step in applying the method of determining the quality of a production lot of polishing pads is polishing the wafers. In the preferred embodiment, four polishing pads from a production lot of unknown quality are selected at random. The polishing pads are then used to polish a small number of wafers, approximately 20 to 40. Because of the discriminant function's accuracy in determining pad quality, assessing polishing pad production lot quality places only these 20 to 40 Grade I wafers at risk.

Secondly, the polished wafer surfaces are divided into discrete sites (FIG. 1). Global parameters, measurements taken over the entire wafer surface, are useful to describe the overall shape of the wafer surface, but more specific descriptions of wafer flatness are available from measurements taken at specific sites on the surface of the wafer. To measure site data, the wafer is divided into areas of equal size, called blocks or sites (FIG. 1). Sites that rest on the edge of the wafer, having only some of their area covering wafer material, are called partial sites. According to conventional measurement methods, utilization of partial sites in the analysis is called partials active, while disregarding measurements from the partial sites is called partials inactive. The method and discriminant function disclosed herein apply this partials active methodology, but the use of partials inactive is also contemplated by the present invention. The steps described herein were applied to 150 mm diameter wafers, and the disclosed method equally applies to any size wafer. For a 150 mm wafer, division into square sites measuring 20 mm per side creates an array of 42 sites, including the partial sites, as shown in FIG. 1. Site selection excludes additional possible sites, beyond the chosen 42, near the wafer's edge where only a small portion of the wafer surface lies within the site area. Sites 20 mm square were selected for convenience due to previous testing and familiarity with sites of that size, but the invention is equally applicable to sites of any size. Variations in site size inversely influence the number of sites and hence the number of terms in the discriminant function.

Each individual site is compared with an ideal reference plane lying parallel to the wafer surface. The reference plane is determined for each wafer, representing a theoretical wafer surface for a perfectly flat wafer. For each site on the wafer, measurements are taken to determine the highest point on the wafer above the reference plane and the lowest point below the reference plane. From this data, a Site Total Indicated Reading ("STIR") is calculated for each site. A STIR value is defined as the absolute value of the difference between the highest point on the surface above the reference plane and the lowest point on the surface below the reference plane, measured for a particular site. The numerical values printed within each wafer site of FIG. 1 are examples of STIR values for a particular wafer, measured in microns and included for illustrative purposes only. For each site, the STIR values from all wafers are averaged, creating an average STIR value for each wafer site. The discriminant function may also be applied with the site data from a single wafer, rather than an average, yielding a score for each wafer. Yet averaging the STIR values from several wafers helps diminish the variability among the wafers, yielding better predictive results from the model. Once the average STIR value is calculated for each of the 42 sites, the wafer parameter calculations are complete.

Finally, the average STIR value for each site is incorporated into the discriminant function developed for determining production lot quality. The specific mathematical manipulations required for developing the discriminant function are disclosed below. Without describing those manipulations here, the completed discriminant function is a multivariate equation where the score assigned to the wafer set is equal to a 43-term equation. The equation is generally described as follows, where n corresponds to a given site on the wafers, $k_n$ is a coefficient associated with each site, $STIR_n$ is a STIR value, or average STIR value, calculated for a particular site, and K is a constant.

$$\text{Wafer Score} = \left[ \sum_{n=1}^{42} k_n \times STIR_n \right] + K$$

For each n, the corresponding $k_n$ is shown in the table below

| n | $k_n$ |
|---|---|
| 1 | 27.6541 |
| 2 | −34.4280 |
| 3 | 22.7819 |
| 4 | −18.2658 |
| 5 | 24.2175 |
| 6 | 43.1701 |
| 7 | −41.2147 |
| 8 | −73.4596 |
| 9 | 53.7823 |
| 10 | 16.4453 |
| 11 | −40.7502 |
| 12 | 65.8762 |
| 13 | −24.3527 |
| 14 | 0.8131 |
| 15 | 51.1921 |
| 16 | 9.9745 |
| 17 | −72.3086 |
| 18 | 42.1638 |
| 19 | 77.8138 |
| 20 | −95.3322 |
| 21 | 29.5464 |
| 22 | 21.1809 |
| 23 | 82.9665 |
| 24 | −30.8951 |

-continued

| n | $k_n$ |
|---|---|
| 25 | −37.6718 |
| 26 | 32.2530 |
| 27 | 47.7779 |
| 28 | −27.9731 |
| 29 | 36.4543 |
| 30 | 1.9785 |
| 31 | −46.7896 |
| 32 | −7.0598 |
| 33 | 65.8851 |
| 34 | −33.0542 |
| 35 | −51.4189 |
| 36 | 13.0116 |
| 37 | 21.1945 |
| 38 | −31.2258 |
| 39 | −31.0760 |
| 40 | 1.3811 |
| 41 | −8.8668 |
| 42 | 61.2205 |

The constant K is equivalent to −32.0343. The development of each of the 43 terms is discussed infra. Each of the first 42 terms of the equation corresponds to an average STIR value calculated for a particular site, multiplied by the discriminant function coefficient ($k_n$) developed for that particular site. The 43rd term of the equation is an additional constant. Each of the 43 terms is calculated and their results are subsequently summed.

The following equation shows the discriminant function with the coefficients and constant represented numerically:

Wafer Score=$27.6541 \times STIR_1 - 34.428 \times STIR_2 + \ldots + 61.2205 \times STIR_{42} - 32.0343$ The resulting total is the score for the set of wafers. If the score is greater than zero, the polishing pads belong to a good production lot. Conversely, if the core is less than zero, the polishing pads belong to a bad production lot. For example, in applying the preferred embodiment to 24 wafers polished by pads from a bad polishing lot, the poor quality of the pads was easily recognizable because the wafer score was less than zero. Applying the preferred embodiment to 24 wafers polished by pads from a good polishing lot, the good quality of the pads is easily recognizable because the score was greater than zero. As the scores increase from zero, the quality of the polishing pad lot increases. For example, a pad lot scoring 4 would be of greater quality than a pad lot scoring 2. Because the discriminant function yields a quantitative result, a numerical score, the quality of the production lot of polishing pads can be readily ascertained with little data interpretation and no qualitative judgments.

In an alternate embodiment, a wafer score may be calculated for each wafer, creating a set of 20 to 40 numerical scores for a selection of polishing pads. The 20 to 40 scores are then plotted on a bar chart having score ranges along the x-axis and the number of wafers in that score range determining the height of the bar along the y-axis. The data set from each class should yield a normal distribution of wafer scores. If the distribution of scores is greater than zero, polishing pads from a good production lot polished the wafers. Conversely, if the distribution of scores is less than zero, polishing pads from a bad production lot polished the wafers.

The method described in the present invention is applicable to discriminant functions having more than two qualitative levels, or classes. For example, rather than choosing two classes, the present invention could divide polishing pad production lot quality into four classes: superb, good, fair, and poor. With four classes, a discriminant analysis of the pads would yield three discriminant functions. The discriminant analyses described herein are similar to the analysis and description in the text of Applied Multivariate Statistical Analysis, the disclosure of which is incorporated by reference. R. A. J OHNSON & D. W. W ICHERN, Applied Multivariate Statistical Analysis 53–56, 62, 470–82, 509–510 (2d ed., Prentice Hall International 1988).

The data manipulations required to initially establish the discriminant function for this application are hereinafter described. First, data must be collected from wafers polished on good and bad quality pads. This data should be in the form of STIR values for each of the 42 sites on each wafer. From this data, the mean, standard deviation, and coefficient of correlation will each be calculated. For calculation of the mean, the data from the good polishing pads should be analyzed separately from the data from the bad polishing pads. The mean for each site is designated $x_n$, where n denotes the site number. For calculating the standard deviation and the coefficient of correlation, the data from both the good and bad polishing pads should be analyzed together. The standard deviation is designated $\sigma_n$, where n denotes the site number. The coefficient of correlation between the two sets of data is designated $\rho_{n,m}$, where n denotes the site number corresponding to the first data class and m denotes the site number corresponding to the second data class.

Once the raw data is calculated, a vector of sample averages is constructed from the data for each class. With 42 variables from each wafer, two vectors are calculated, each being a 42 row by 1 column array, representing the mean STIR values from each site. In the following arrays, $x_1$ bar and $x_2$ bar each represent vector arrays containing the mean values for wafer sites 1 to 42; $x_1$ bar representing the mean STIR values for the wafers polished on good pads and $x_2$ bar representing the mean STIR values for the wafers polished on bad pads.

$$\bar{x}_1 = \begin{bmatrix} x_1 \\ x_2 \\ \vdots \\ x_{41} \\ x_{42} \end{bmatrix} \quad \text{and} \quad \bar{x}_2 = \begin{bmatrix} x_1 \\ x_2 \\ \vdots \\ x_{41} \\ x_{42} \end{bmatrix}$$

Assuming both populations have the same covariance matrix, as is required in any discriminant function analysis, the covariance matrices for each class are combined to from a single population variance-covariance matrix. The single population variance-covariance matrix is designated $S_{pooled}$. The covariance matrix is a 42 by 42 matrix, defined as follows:

$$S_{pooled} = \begin{bmatrix} \sigma_1\sigma_1 & \sigma_1\sigma_2\rho_{1,2} & \sigma_1\sigma_3\rho_{1,3} & \cdots & \sigma_1\sigma_{42}\rho_{1,42} \\ \sigma_2\sigma_1\rho_{2,1} & \sigma_2\sigma_2 & \sigma_2\sigma_3\rho_{2,3} & \cdots \\ \sigma_3\sigma_1\rho_{3,1} & \sigma_3\sigma_2\rho_{3,2} & \sigma_3\sigma_3 & \cdots \\ \vdots & & & \ddots & \vdots \\ \sigma_{42}\sigma_1\rho_{42,1} & \cdots & \cdots & \cdots & \sigma_{42}\sigma_{42} \end{bmatrix}$$

With $S_{pooled}$ in hand, the inverse of $S_{pooled}$ is calculated, employing standard techniques for matrix invention, yielding $[S_{pooled}]^{-1}$.

With $[S_{pooled}]-1$, $x_1$ bar, and $x_2$ bar, the discriminant function is readily calculated. The discriminant function for two classes is generally defined as follows:

$$Y = [\bar{x}_1 - \bar{x}_2][S^{-1}_{pooled}][x_n]$$

Applying the data from this application to the general discriminant function, the equation yields a three-term matrix multiplication. A 1 row by 42 column matrix ($x_1$ bar minus $x_2$ bar) is first multiplied by a 42 row by 42 column matrix ($[S_{pooled}]^{-1}$) and then multiplied by a 42 row by one column matrix (an $x_n$ for each site). The resulting equation is the 42 term equation described below:

$$\text{Wafer Score} = 27.6541 \times x_1 - 34.428 \times x_2 + \ldots + 61.2205 \times x_{42}$$

Applying the equation to the present embodiment by substituting a more descriptive variable for $x_n$, the equation yields:

$$\text{Wafer Score} = 27.6541 \times STIR_1 - 34.428 \times STIR_2 + \ldots + 61.2205 \times STIR_{42}$$

The final data manipulation relates to shifting the intercept of the discriminant function by adding a constant term. It is desirable to have positive wafer scores for good production pads and negative wafer scores for bad production pads. Accordingly, the constant K, equivalent to −32.0343, was added to the equation to decrease the raw scores such that wafer scores from good pads would remain positive while wafer scores from bad pads would be negative. In doing so, the quality of the polishing pads is readily apparent from the sign of the scores. Additionally, as the score increases above zero, the quality and performance of the pads increase. With the final discriminant function developed, new data may be inserted into the function as described above, yielding scores which accurately and efficiently classify the polishing pads. The discriminant function coefficients may be redefined by collecting and incorporating more data, but such a process is not typically required unless another process variable changes significantly.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A testing and analyzing method for determining the performance characteristics of a production lot of polishing pads, comprising the steps of:
    polishing a plurality of semiconductor wafers with a selected number of polishing pads from the production lot of polishing pads;
    dividing at least a portion of the surface area of each of the plurality of semiconductor wafers into a plurality of sites;
    measuring at least one wafer characteristic from each site; and
    incorporating said wafer characteristic from each site into a discriminant function selected to predict the performance characteristics of a production lot of polishing pads by the quantitative level of the data obtained from a plurality of semiconductor wafers polished by the selected number of polishing pads.

2. A method according to claim 1, comprising dividing the surface area of each of the plurality of semiconductor wafers into a plurality of sites of the same area and shape.

3. A method according to claim 2, comprising dividing the surface area of each of the plurality of semiconductor wafers into a plurality of sites forming a grid of sites.

4. A method according to claim 1, wherein said step of incorporating said wafer characteristic comprises determining flatness for each site.

5. A method as set forth in claim 4 wherein determining flatness for each site comprises calculating a Site Total Indicated Reading ("STIR") for each site, the STIR value being defined as an absolute value of a difference between a highest point of a site above a reference plane and a lowest point of a site below the reference plane, the reference plane representing a theoretical wafer surface for a perfectly flat wafer and lying generally parallel to the wafer surface.

6. A method according to claim 1, wherein said step of polishing said wafers comprises polishing fewer than 40 wafers.

7. A method according to claim 6, wherein said step of polishing said wafers comprises polishing at least 20 wafers.

8. A method according to claim 1, wherein said step of incorporating said wafer characteristic from each site into a discriminant function is preceded by a step of calculating an average wafer characteristic for each site from the plurality of wafers and subsequently incorporating the average from each site into the discriminant function.

9. A method according to claim 1, wherein said step of polishing comprises selecting multiple polishing pads from the production lot.

10. A method according to claim 9, wherein said step of polishing comprises selecting a number of polishing pads less than the total number of pads within the production lot.

11. A method as set forth in claim 10, wherein said step of polishing comprises selecting four polishing pads from the production lot.

* * * * *